(12) United States Patent
Romaniuk

(10) Patent No.: US 6,313,939 B1
(45) Date of Patent: Nov. 6, 2001

(54) OPTICAL PHASE OSCILLATOR WITH A MAXIMUM OUTPUT AMPLIFIER

(76) Inventor: Charles Christopher Romaniuk, Box 3295, Vermilion, Alberta (CA), T9X 2B2

( * ) Notice: Subject to any disclaimer, the term of this patent is extended or adjusted under 35 U.S.C. 154(b) by 0 days.

(21) Appl. No.: 09/667,821

(22) Filed: Sep. 22, 2000

(51) Int. Cl.$^7$ ................................................ G06G 7/00
(52) U.S. Cl. ........................... 359/333; 359/108; 364/713
(58) Field of Search .................. 359/333; 364/807, 364/713; 354/108, 577

(56) References Cited

U.S. PATENT DOCUMENTS

| | | |
|---|---|---|
| 4,469,397 | 9/1984 | Shaw et al. . |
| 5,093,802 | * 3/1992 | Hait ....................................... 364/807 |
| 5,555,126 | 9/1996 | Hait . |
| 5,699,371 | 12/1997 | Handa et al. . |

OTHER PUBLICATIONS

Stremler, F. G. (1990). "Introduction to Communication Systems" (3rd ed.). Reading, MA: Addison–Wesley Publishing Company. pp. 618–619.

* cited by examiner

Primary Examiner—Mark Hellner

(57) ABSTRACT

An optical phase oscillator with a maximum output amplifier generates an oscillating phase signal and employs an amplifier that is operated at maximum output to maintain a constant magnitude oscillator output signal. A non-maximum output amplifier with a signal limiter can also be used.

The device receives a continuous or semi-continuous wave input signal and produces an oscillating phase output signal that has the same wavelength as the input signal. The phase oscillator consists of a combiner, an amplifier, a phase inverter, and a splitter. The coherent input signal is used as an initialization signal to start the oscillations and does not need to remain on for steady-state operation. An inverted phase feedback signal advances the oscillations. The amplifier provides a signal large enough to be split into the output signal and a feedback signal. The steady-state output signal is a constant magnitude continuous wave oscillating binary phase shift-keying (BPSK) signal and is maintained without an input signal. The device is ideally suited for integrated optic components.

30 Claims, 5 Drawing Sheets

OPTICAL PHASE OSCILLATOR WITH A MAXIMUM OUTPUT AMPLIFIER

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A "MICROFICHE APPENDIX"

Not Applicable.

BACKGROUND OF THE INVENTION

1. Field of the Invention

The present invention relates in general to optical oscillators and phase modulators and relates in particular to optical phase oscillators that produce a continuous wave digital phase output.

2. Discussion of Related Art

Oscillators are well-known in electronics and are essential components for synchronizing interconnected circuits. Oscillators are used primarily as system clocks to synchronize the activities of interacting circuits. Most electronic circuits rely on a crystal to provide oscillations for a system clock.

Typically, optical circuits rely on generated pulses from a laser resonator to form an oscillating signal. Electrical pulses are used to power a laser resonator for creating optical pulses, or a saturable absorber is used in a laser resonator to release pulses greater than a threshold value.

However, phase optical circuits are becoming a viable alternative to pulsed optical circuits and require a phase oscillating signal for complex circuits. Several methods exist for creating a phase oscillator.

In one method, an electro-optic effect is used to alter the optical phase delay of a waveguide through which an optical signal travels. An electric signal is oscillated which induces a corresponding oscillating e change of the optical signal in the waveguide. However, this method is slower than an all-optical method due to the speed of the electro-optic effect and the speed limitations of oscillating an electrical signal.

A similar method based on optical intensity dependent phase changes, resulting from refractive index changes, has been developed. This method uses a pulsed optical signal to change the refractive index of a waveguide through which a continuous wave optical signal travels. This method is also slower than a dedicated phase oscillator due to the speed and magnitude of the refractive index changes.

Another method employs an optical phase logic gate with a feedback signal for generating an oscillating signal. However, the logic gate provides unused functionality and unnecessary circuitry that results in an oscillation cycle time greater than the cycle time of a dedicated oscillator device.

Dedicated all-optical phase oscillators provide better phase oscillating output signals than the methods described above.

In an all-optical method, the symmetric on/off cycle output pulses from a light pulse generator are converted to continuous wave phase oscillating signals by combining the pulses with a continuous wave beam that is half the magnitude of and opposite in phase to the pulses. However, this method is more complex to design and operate than a phase oscillator which uses only a phase signal because phase matching is required.

In U.S. Pat. No. 5,555,126, Hait describes a phase oscillator that uses special interference to transfer all of the input energy into the output signal. The oscillator design uses feedback, but does not include a specification for an integrated optic design. Also, the output signal is generated only when the input signal is present. The output signal power is obtained directly from the input signal.

Optical phase modulated circuits are becoming more prevalent and more useful in optics. A simpler and more easily manufactured optical phase oscillator is necessary. It is, therefore, an object of the present invention to provide such a phase oscillator.

BRIEF SUMMARY OF THE INVENTION

An optical phase oscillator device with a maximum output amplifier employs simple integrated optic components which are commonly available. The device is a digital phase oscillator and uses an amplifier operating at a maximum output magnitude to produce a continuous wave constant magnitude output signal. The amplifier is maintained at its maximum output so that spontaneous emission in the amplifier is suppressed and constant magnitude output signals of oscillating phase are generated.

The phase oscillator receives a semi-continuous or continuous wave input signal and produces an oscillating phase output signal with the same wavelength as the input signal. The phase oscillator consists of a combiner, an amplifier, a phase inverter, and a splitter. The semi-continuous or continuous wave coherent input signal is used as an initialization signal to start the oscillations. An inverted phase feedback signal advances the oscillations. The amplifier provides a signal large enough to be split into the output signal and a feedback signal. The amplifier is operated at maximum output to maintain a constant output magnitude that is suitable for optical phase logic circuits. The steady-state output signal is a continuous wave oscillating binary phase shift-keying (BPSK) signal and is maintained without an input signal.

The device is ideally suited for design with integrated optic components.

DETAILED DESCRIPTION OF THE INVENTION

Figure 1:
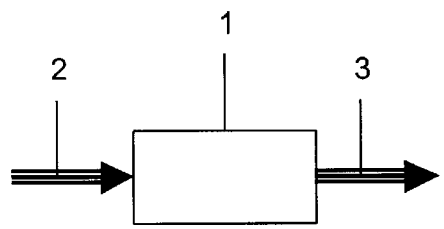
FIG. 1 is a plan view of the optical phase oscillator.
Figure 2:
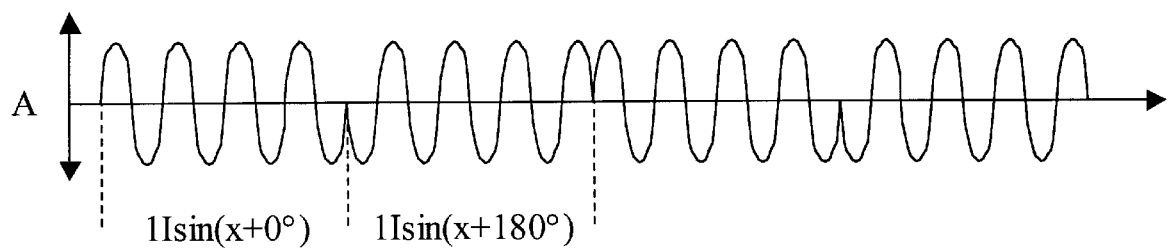
FIG. 2 shows an example output waveform of the device of FIG. 1.

Referring to FIG. 1, an optical phase oscillator device 1 receives a coherent input signal 2 and produces an oscillating phase output signal 3 that has the same wavelength as the input signal 2. The output signal 3 is an oscillating binary phase shift keying (BPSK) signal, such as a signal A shown in FIG. 2. The example signal A oscillates every four wavelengths between a waveform of 1Isin(x+0°) and an inverted waveform of 1Isin(x+180°).

Figure 3:
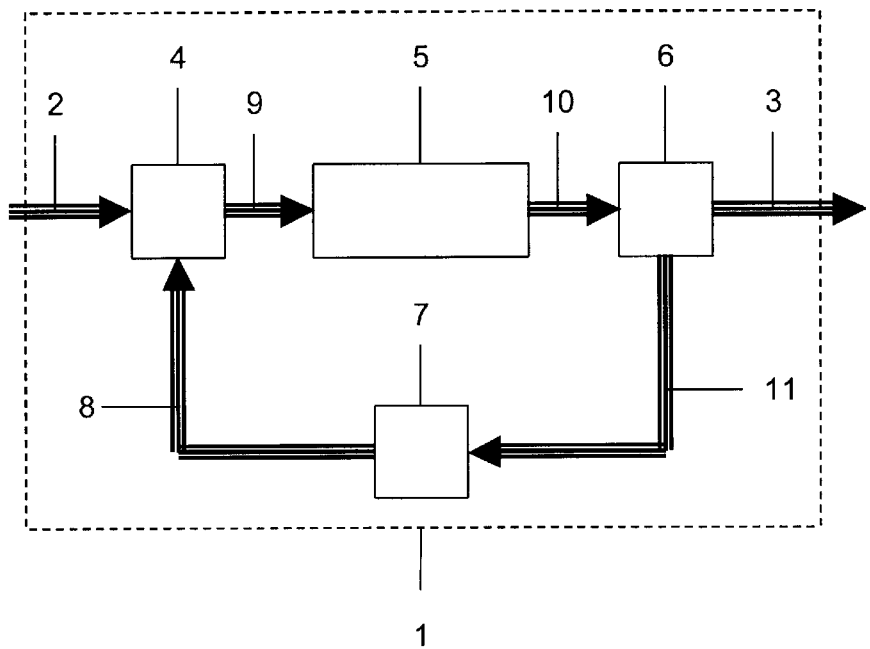
FIG. 3 shows a schematic of an embodiment of the optical phase oscillator of FIG. 1.

As shown in FIG. 3, the phase oscillator device 1 consists of a combiner 4, an amplifier 5, a splitter 6, and a phase inverter 7. The coherent input signal 2 is used as an initialization signal to start the oscillations. The combiner 4 combines the input signal 2 with an inverted feedback signal 8 to produce a combined signal 9. The combined signal 9 is then amplified by the amplifier 5 to produce an amplified signal 10. The splitter 6 divides the amplified signal 10 to produce the output signal 3 and a feedback signal 11. The phase inverter 7 inverts the phase of the feedback signal 11 to produce the inverted feedback signal 8. The combiner 4 then combines the inverted feedback signal 8 with the input signal 2 to complete the feedback loop.

The following description of the form and operation of the phase oscillator device 1 is illustrated by way of example only.

The input signal 2 is an externally generated semi-continuous wave coherent beam with fixed wavelength and polarization values. The input signal 2 is used to initialize the oscillations and preferably does not remain active once the oscillations have begun. The input signal 2 is preferably a laser beam. For example, the input signal 2 can be expressed as $$\text{Input}=1I\sin(x+0°)$$

where the relative phase shift of the input signal 2 is 0°, the magnitude is 1, and I is a relative measure of intensity.

The input signal 2 is directed into the first input of the combiner 4. The combiner 4 receives the input signal 2 and combines it with the inverted feedback signal 8 to produce the combined signal 9. Initially, the inverted feedback signal 8 will be substantially negligible and the combined signal 9 preferably will be the entire input signal 2. For example, the initial combined signal 9 can be expressed as $$\text{Combined}=1I\sin(x+0°)$$

The combiner 4 is preferably a non-3 dB combiner, but can be any beam combiner known in the art, such as an integrated optic Y-branch or an integrated optic directional coupler.

The combined signal 9 is then directed into the amplifier 5. The amplifier 5 amplifies the combined signal 9 by a predetermined amplification factor to produce the amplified signal 10. For example, the amplifier 5 with an amplification factor of 4 will produce the initial amplified signal 10 expressed as $$\text{Amplified}=4I\sin(x+0°)$$

Figure 4:
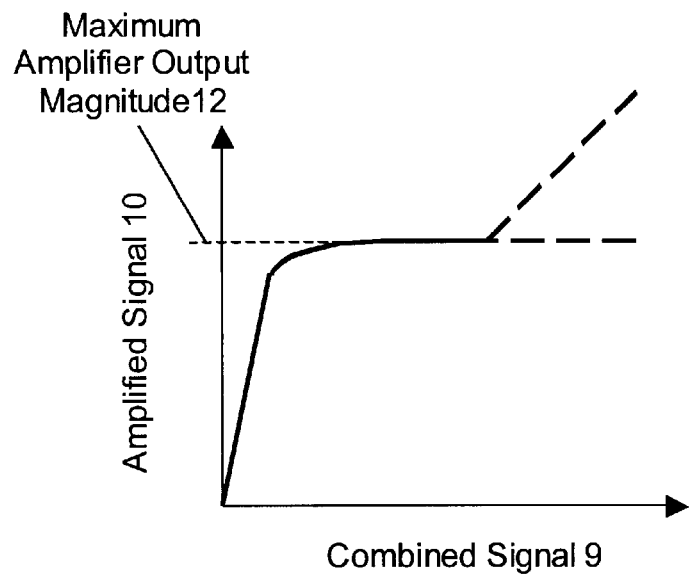
FIG. 4 provides response behavior of a maximum output amplifier of FIG. 3.

The amplifier 5 preferably has a maximum amplifier output magnitude 12, as shown in FIG. 4. If the combined signal 9 is less than the maximum amplifier output magnitude 12, it is amplified, producing the amplified signal 10 so that it is less than, or equal to, but not greater than, the maximum amplifier output magnitude 12. If the combined signal 9 is greater than the maximum amplifier output magnitude 12 which preferably does not occur in the phase oscillator device 1, it should be limited to the maximum amplifier output magnitude 12 or else transmitted through the amplifier 5 unaffected to produce the amplified signal 10. The amplifier 5 is preferably any non-cavity amplifier known in the art, such as a semiconductor laser amplifier or a traveling wave amplifier. For example, because a semiconductor laser amplifier can not have an infinite physical voltage and current supply, it has an amplified output limit of the maximum amplifier output magnitude 12.

The amplified signal 10 is then directed into the splitter 6. The splitter 6 receives the amplified signal 10 and splits it into the output signal 3 and the feedback signal 11. For example, the initial output signal 3 and the feedback signal 11 can be expressed as $$\text{Output}=2I\sin(x+0°)$$

$$\text{Feedback}=2I\sin(x+0°)$$

The splitter 6 can be any beam splitter known in the art, such as an integrated optic Y-branch or an integrated optic directional coupler.

The phase inverter 7 is positioned so that the splitter 6 directs the feedback signal 11 into the input of the phase inverter 7. The phase inverter 7 inverts the phase of the feedback signal 11, by inducing a 180° relative phase shift, to produce the inverted feedback signal 8 that is opposite in phase to the feedback signal 11. For example, the inverted feedback signal 8 can be expressed as $$\text{Inverted Feedback}=2I\sin(x+180°)=-2I\sin(x+0°)$$

since a signal with a relative phase shift of 180° is equivalent to the negative of the same signal with a relative phase shift of 0°. The phase inverter 7 can be any phase inverter known in the art, such as a half wavelength pathlength.

The inverted feedback signal 8 is then directed into the second input of the combiner 4. The combiner 4 combines the inverted feedback signal 8 with the input signal 2 to produce the combined signal 9, thereby completing the feedback loop. Table 1 summarizes the magnitudes and phases of the example phase oscillator device 1 signals for the first 15 iterations. In this example, the input signal 2 is shut off after the seventh iteration, is turned on again with a larger magnitude during the eleventh to thirteenth iterations, and is shut off again after the thirteenth iteration. A negative signal, such as −2Isin(x+0°), is equivalent to a positive signal with a relative phase shift of 180°, 2Isin(x+180°). The example amplifier 5 has an amplification factor of 4, the maximum amplifier output magnitude 12 is 20, and the example amplifier 5 will transmit the combined signal 9 if it is greater than the maximum amplifier output magnitude 12.

TABLE 1

| Iteration | Input Signal 2 | Previous Inverted Feedback Signal 8 | Combined Signal 9 | Amplified Signal 10 | Feedback Signal 11 | Inverted Feedback Signal 8 | Output Signal 3 |
|---|---|---|---|---|---|---|---|
| 0 | 0 | 0 | 0 | 0 | 0 | 0 | 0 |
| 1 | 1 | 0 | 1 | 4 | 2 | −2 | 2 |
| 2 | 1 | −2 | −2 | 2 | −2 | 2 | −2 |
| 3 | 1 | 2 | 3 | 12 | 6 | −6 | 6 |
| 4 | 1 | −6 | −5 | −20 | −10 | 10 | −10 |
| 5 | 1 | 10 | 11 | 44→20 | 10 | −10 | 10 |
| 6 | 1 | −10 | −9 | −36→−20 | −10 | 10 | −10 |
| 7 | 1 | 10 | 11 | 44→20 | 10 | −10 | 10 |
| 8 | 0 | −10 | −10 | −40→−20 | −10 | 10 | −10 |
| 9 | 0 | 10 | 10 | 40→20 | 10 | −10 | 10 |
| 10 | 0 | −10 | −10 | −40→−20 | −10 | 10 | −10 |
| 11 | 20 | 10 | 30 | 30 | 15 | −15 | 15 |
| 12 | 20 | −15 | 5 | 20 | 10 | −10 | 10 |
| 13 | 20 | −10 | 10 | 40→20 | 10 | −10 | 10 |
| 14 | 0 | −10 | −10 | 40→−20 | −10 | 10 | −10 |
| 15 | 0 | 10 | 10 | 40→20 | 10 | −10 | 10 |

The inverted feedback signal 8 is preferably always opposite in phase to the previous combined signal 9 before the input signal 2 and the inverted feedback signal 8 are combined. For example in iteration 3, the phase of the previous inverted feedback signal 8, 2Isin(x+0°), is opposite the phase of the combined signal 9, 1Isin(x+180°), in iteration 2.

The phase oscillator device 1 has three regions of operation: an initialization operating region, a steady-state operating region, and an anomalous operating region. The steady-state operating region is preferable for generating phase oscillating output signals.

In the initialization operating region, the magnitude of the output signal 3 increases and the phase oscillates between the relative phases of 0° and 180° as the oscillations progress, shown by iterations 0–3 in Table 1. Once the amplified signal 10 is equal to the maximum amplifier output magnitude 12, the output signal 3 has a constant magnitude and an oscillating phase, as shown by iterations 4–10 and 14–15 in Table 1, and the phase oscillator device 1 is in the steady-state operating region. In the anomalous operating region, the magnitude of the output signal 3 may oscillate and the phase remains constant, or both the phase and magnitude oscillate, or neither the phase nor the magnitude oscillates, as shown by iterations 11–13 in Table 1.

A number of design and operating conditions of the phase oscillator device 1 can be described by simple equations.

The magnitude of the output signal 3 in the steady-state operating region is determined by $$\text{output} = \text{max} \cdot \text{split}_{output}$$

where output is the magnitude of the output signal 3, max is the magnitude of the maximum amplifier output magnitude 12, and $\text{split}_{output}$ is the splitter output fraction. The splitter output fraction is the fractional weighted value of the output signal 3 in the splitter 6 and is ½ for a splitter that divides a signal into two substantially equal signals. For example, using the magnitude of the maximum amplifier output magnitude 12 of 20 and the splitter output fraction of ½, the magnitude of the output signal 3 in the steady-state operating region is 10.

In the preferred embodiment, the amplification factor of the amplifier 5 is $$amp > \frac{1}{\text{split}_{feedback}}$$

where amp is the amplification factor of the amplifier 5 and split feedback is the splitter feedback fraction. This allows the output signal 3 to reach the steady-state operating region. The splitter feedback fraction is the fractional weighted value of the feedback signal 11 in the splitter 6. For example, using the splitter feedback fraction of ½, the amplification factor of the amplifier 5 should be greater than 2.

Also, to avoid a unique situation in the steady-state operating region where no output signal 3 is generated because of cancellation between the inverted feedback signal 8 and the input signal 2, the magnitude of the input signal 2 should not be equal to the magnitude of the feedback signal 11 in the steady-state operating region, so $$\text{input} \neq \text{max} \cdot \text{split}_{feedback}$$

where input is the magnitude of the input signal 2, max is the magnitude of the maximum amplifier output magnitude 12, and $\text{split}_{feedback}$ is the splitter feedback fraction. For example, using the maximum amplifier output magnitude 12 of 20 and the splitter feedback fraction of ½, the magnitude of the input signal 2 should not be 10.

The input signal 2 can have any magnitude in the initialization or anomalous operating region. The input signal 2 is preferably a semi-continuous wave signal, but can be a pulsed signal. The pulse length of the input signal 2 should be longer than the time required for a signal to travel around the feedback loop. The phase oscillator device 1 will progress to the steady-state operating region once the input signal 2 is shut off. If the input signal 2 is to remain on, the following condition should be met for the phase oscillator device 1 to operate in the steady-state operating region:

$$(amp \cdot split_{feedback}) - \left(\frac{amp \cdot input}{max}\right) \geq 1$$

where amp is the amplification factor of the amplifier 5, split feedback is the splitter feedback fraction, input is the absolute value magnitude of the input signal 2, and max is the magnitude of the maximum amplifier output magnitude 12. For example, from Table 1, the amplification factor of the amplifier 5 is 4, the splitter feedback fraction is ½, the magnitude of the input signal 2 is 1, and the maximum amplifier output magnitude 12 is 20. This results in a value of $$\left(4 \cdot \frac{1}{2}\right) - \left(\frac{4 \cdot 1}{20}\right) = 2 - \frac{1}{5} = 1\frac{4}{5}$$

which is greater than one.

The maximum amplifier output magnitude 12 does not need to be reached in the first iteration, but should be reached within a finite number of iterations around the feedback loop.

Figure 5:
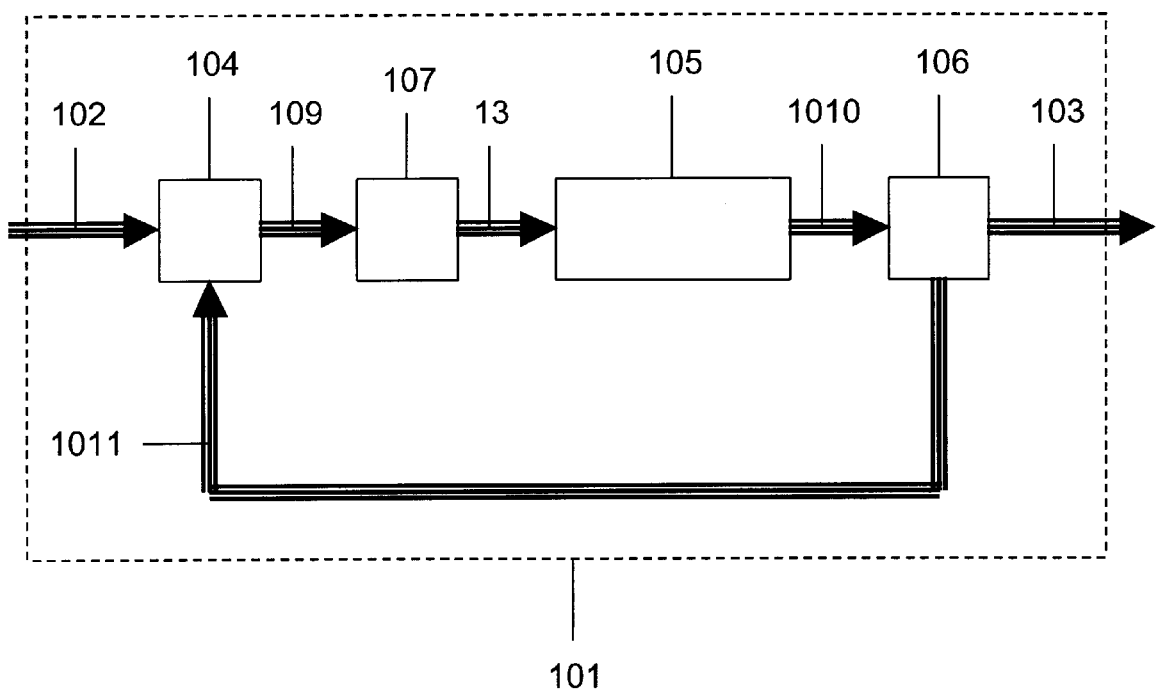
FIG. 5 is an alternative embodiment of FIG. 1.
Figure 6:
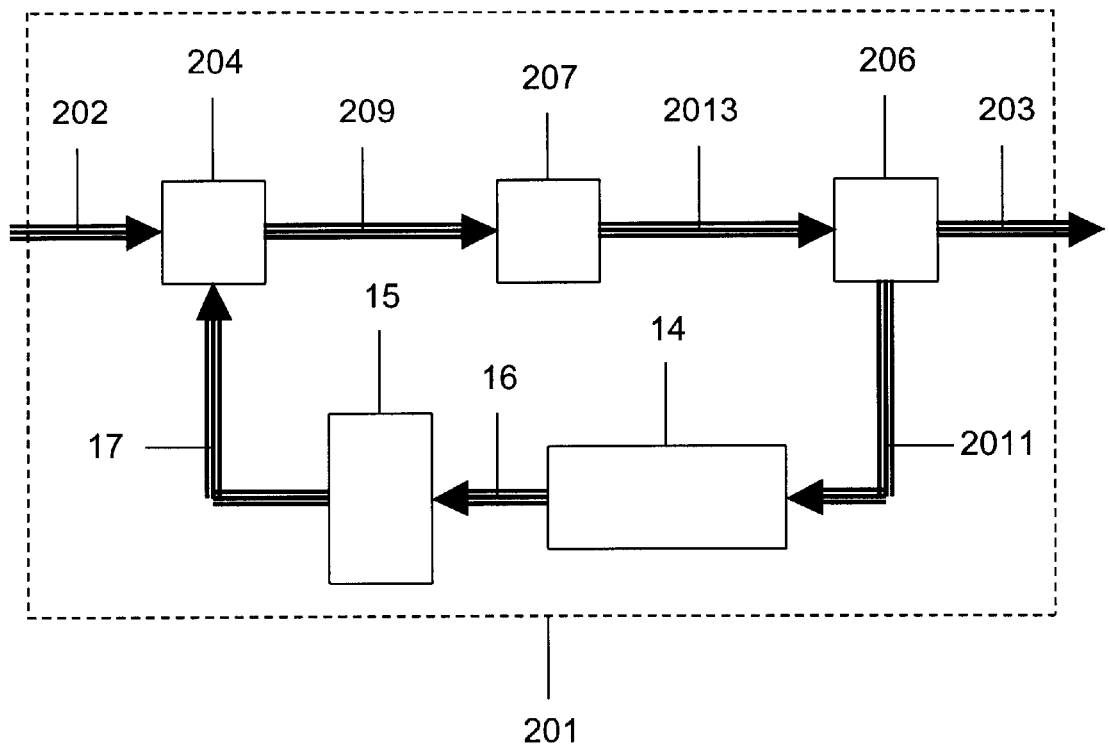
FIG. 6 is a further alternative embodiment of FIG. 1.

Alternative embodiments of the phase oscillator device 1, in which the location of the phase inverter 7 is changed and the location or type of the amplifier 5 is changed, are shown in FIG. 5 and FIG. 6, where like numerals with a prefix 10 and 20 refer to similar elements of the phase oscillator device 1 in FIG. 3. The phase inverter 7 and amplifier 5 can be placed anywhere in the feedback loop. The phase inverter 7 can be placed on the feedback path between the splitter 6 and the combiner 4, as shown in FIG. 3, or phase inverters 107, 207 can be placed on the initial path between a combiner 104, 204 and a splitter 106, 206, as shown in FIG. 5 and FIG. 6. An amplifier 105 can also be placed on the initial path between the combiner 104 and the splitter 106, as shown in FIG. 5, or a non-maximum output amplifier 14 can be placed on the feedback path between the splitter 206 and the combiner 204, as shown in FIG. 6. The amplifier 5 can be replaced with the non-maximum output amplifier 14 followed by a signal limiter 15, as shown in FIG. 6.

The placement of the phase inverters 107, 207 and the amplifiers 105, 14 does not adversely affect the overall operation of phase oscillator devices 101, 201. Output signals 103, 203 of the phase oscillator devices 101, 201 are inverted with respect to the output signal 3 of the phase oscillator device 1 of the first embodiment. If more than one phase inverter 7 is used, an odd number of phase inverters should be used so that, before the feedback signal 11 and the input signal 2 are combined, the feedback signal 11 is substantially opposite in phase to the previous combined signal 9.

Table 2 summarizes the magnitudes and phases of the example signals for the first 10 iterations in the phase oscillator device 101 with the phase inverter 107 placed between the combiner 104 and the amplifier 105, as shown in FIG. 5. In this example, the input signal 102 is shut off after the seventh iteration. A negative signal, such as −2Isin(x+0°), is equivalent to a positive signal with a relative phase shift of 180°, 2Isin(x+180°). The example amplifier 105 has an amplification factor of 4 and a maximum amplifier output magnitude of 20. The example splitter 107 has a splitter fraction of ½.

TABLE 2

| Iteration | Input Signal 102 | Previous Feedback Signal 1011 | Combined Signal 109 | Inverted Combined Signal 13 | Amplified Signal 1010 | Feedback Signal 1011 | Output Signal 103 |
|---|---|---|---|---|---|---|---|
| 0 | 0 | 0 | 0 | 0 | 0 | 0 | 0 |
| 1 | 1 | 0 | 1 | −1 | −4 | −2 | −2 |
| 2 | 1 | −2 | −1 | 1 | 4 | 2 | 2 |
| 3 | 1 | 2 | 3 | −3 | −12 | −6 | −6 |
| 4 | 1 | −6 | −5 | 5 | 20 | 10 | 10 |
| 5 | 1 | 10 | 11 | −11 | 44→−20 | −10 | −10 |
| 6 | 1 | −10 | −9 | 9 | 36→20 | 10 | 10 |
| 7 | 1 | 10 | 11 | −11 | −44→−20 | −10 | −10 |
| 8 | 0 | −10 | −10 | 10 | 40→20 | 10 | 10 |
| 9 | 0 | 10 | 10 | −10 | −40→−20 | −10 | −10 |
| 10 | 0 | −10 | −10 | 10 | 40→20 | 10 | 10 |

Figure 7:
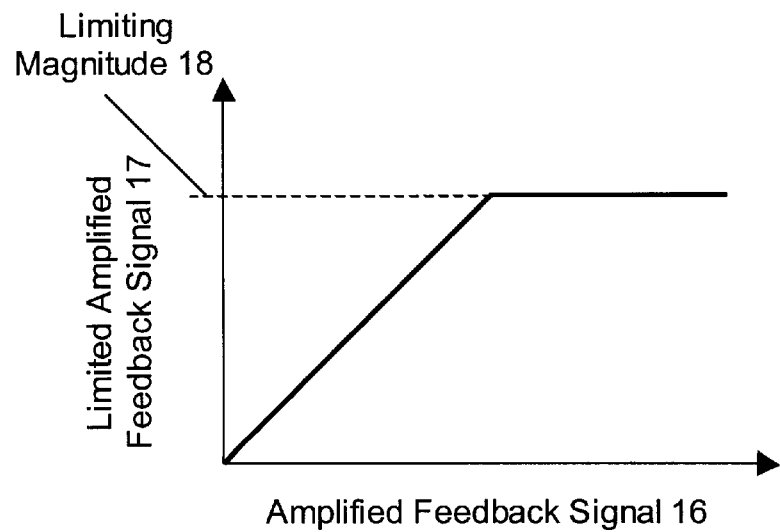
FIG. 7 provides response behavior of a signal limiter of FIG. 6.

Preferably, the maximum output amplifier 5 is used in the device 1. However, as shown in FIG. 6, the non-maximum output amplifier 14, in combination with the signal limiter 15, may be used in the device 201 instead of the maximum output amplifier 5. The non-maximum output amplifier 14 operates as a normal amplifier without utilizing a maximum amplifier output magnitude. The signal limiter 15, such as an optical fullerene, receives an amplified feedback signal 16 and produces a limited amplified feedback signal 17 that is less than, or equal to, a limiting magnitude 18, as shown in FIG. 7. If the amplified feedback signal 16 is less than, or equal to, the magnitude 18, it is partially, or preferably entirely, transmitted through the limiter 15. If the amplified feedback signal 16 is greater than the limiting magnitude 18, it is attenuated to the limiting magnitude 18. Table 3 summarizes the magnitudes and phases of the example signals for the first 10 iterations in the phase oscillator device 201 with the phase inverter 207 placed between the combiner 204 the splitter 206 and with the non-maximum amplifier 14, followed by the signal limiter 15, placed between the splitter 206 and the combiner 204 on the feedback path, as shown in FIG. 6. In this example, the input signal 202 is shut off after the seventh iteration. A negative signal, such as −2Isin(x+0°), is equivalent to a positive signal with a relative phase shift of 180°, 2Isin(x+180°). The example amplifier 14 has an amplification factor of 4 and the limiting magnitude 18 of the example signal limiter 15 is 20. The example splitter 206 has a feedback fraction of ½.

TABLE 3

| Iteration | Input Signal 202 | Previous Limited Amplified Feedback Signal 17 | Combined Signal 209 | Inverted Combined Signal 2013 | Feedback Signal 2011 | Amplified Feedback Signal 16 | Limited Amplified Feedback Signal 17 | Output Signal 203 |
|---|---|---|---|---|---|---|---|---|
| 0 | 0 | 0 | 0 | 0 | 0 | 0 | 0 | 0 |
| 1 | 1 | 0 | 1 | −1 | −½ | −2 | −2 | −½ |
| 2 | 1 | −2 | −1 | 1 | ½ | 2 | 2 | ½ |
| 3 | 1 | 2 | 3 | −3 | −1½ | −6 | −6 | −1½ |
| 4 | 1 | −6 | −5 | 5 | 2½ | 10 | 10 | 2½ |
| 5 | 1 | 10 | 11 | −11 | −5½ | −22 | −20 | −5½ |
| 6 | 1 | −20 | −19 | 19 | 9½ | 38 | 20 | 9½ |
| 7 | 1 | 20 | 21 | −21 | −10½ | −42 | −20 | −10½ |
| 8 | 0 | −20 | −20 | 20 | 10 | 40 | 20 | 10 |
| 9 | 0 | 20 | 20 | −20 | −10 | −40 | −20 | −10 |
| 10 | 0 | −20 | −20 | 20 | 10 | 40 | 20 | 10 |

In this example, because the amplifier 14 is placed on the feedback path between the splitter 206 and the combiner 204, the phase oscillator device 201 will not operate in the steady-state operating region when the input signal 202 is on. The phase oscillator device 201 will only enter the steady-state operating region once the input signal 202 is shut off. Therefore, the phase oscillator device 201 will not obey the steady-state condition $$(amp \cdot split_{feedback}) - \left(\frac{amp \cdot input}{max}\right) \geq 1$$

where amp is the amplification factor of the amplifier 14, $split_{feedback}$ is the splitter feedback fraction, input is the magnitude of the input signal 202, and max is the limiting magnitude 18 of the signal limiter 15.

Figure 8:
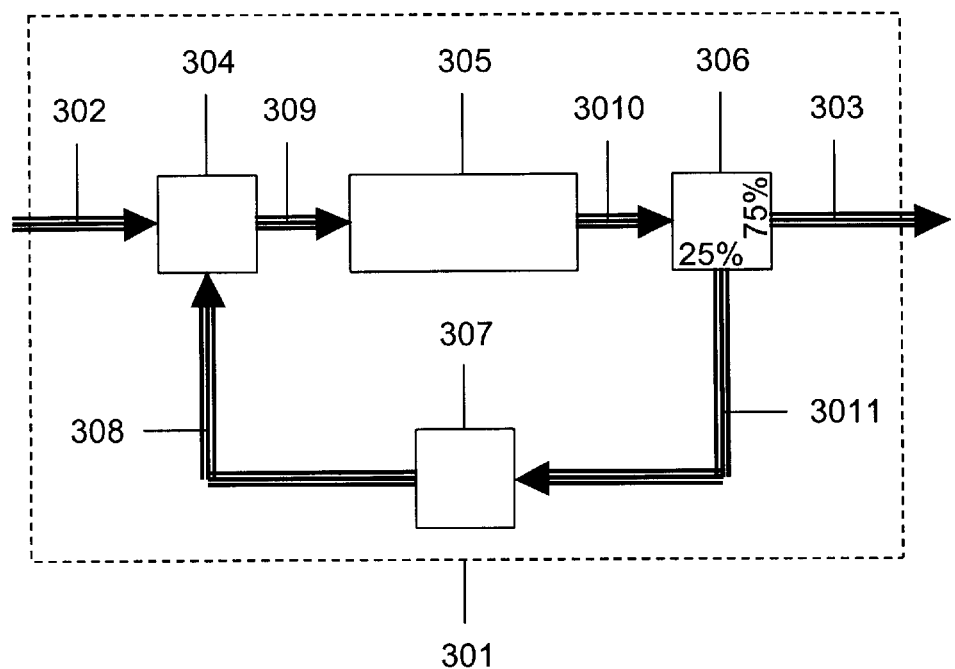
FIG. 8 is another alternative embodiment of FIG. 1.

FIG. 8 shows a further alternative embodiment of the phase oscillator device 1 in which a weighted splitter 306 is used and where like numerals with a prefix 30 refer to similar elements of the phase oscillator device 1 in FIG. 3. The weighted splitter 306 may be used to reduce the magnitude of a feedback signal 3011 and produce a larger magnitude output signal 303.

Table 4 summarizes the magnitudes of the example signals for the first 10 iterations in a phase oscillator device 301 using the weighted splitter 306 with a phase inverter 307 placed on the feedback path between the weighted splitter 306 and a combiner 304. The weighted splitter 306 divides an amplified signal 3010 with a ratio of 3:1 where the output signal 303 weighting is 75% and the feedback signal 3011 weighting is 25%. In this example, an input signal 302 is shut off after the seventh iteration. A negative signal, such as −2Isin(x+0°), is equivalent to a positive signal with a relative phase shift of 180°, 2Isin(x+180°). An example amplifier 305 has an amplification factor of 8 and a maximum amplifier output magnitude of 40. The example weighted splitter 306 has a splitter feedback fraction of ¼.

TABLE 4

| Iteration | Input Signal 302 | Previous Inverted Feedback Signal 308 | Combined Signal 309 | Amplified Signal 3010 | Feedback Signal 3011 | Inverted Feedback Signal 308 | Output Signal 303 |
|---|---|---|---|---|---|---|---|
| 0 | 0 | 0 | 0 | 0 | 0 | 0 | 0 |
| 1 | 1 | 0 | 1 | 8 | 2 | −2 | 6 |
| 2 | 1 | −2 | −1 | −8 | −2 | 2 | −6 |
| 3 | 1 | 2 | 3 | 24 | 6 | −6 | 18 |
| 4 | 1 | −6 | −5 | −40 | −10 | 10 | −30 |
| 5 | 1 | 10 | 11 | 88→40 | 10 | −10 | 30 |
| 6 | 1 | −10 | −9 | −72→−40 | −10 | 10 | −30 |
| 7 | 1 | 10 | 11 | 88→40 | 10 | −10 | 30 |
| 8 | 0 | −10 | −10 | −80→−40 | −10 | 10 | −30 |
| 9 | 0 | 10 | 10 | 80→40 | 10 | −10 | 30 |
| 10 | 0 | −10 | −10 | −80→−40 | −10 | 10 | −30 |

Further alternative embodiments are possible by combining the operations of components. For example, an inverting amplifier may be used in place of the amplifier 105 and the inverter 107 in FIG. 5.

Figure 9:
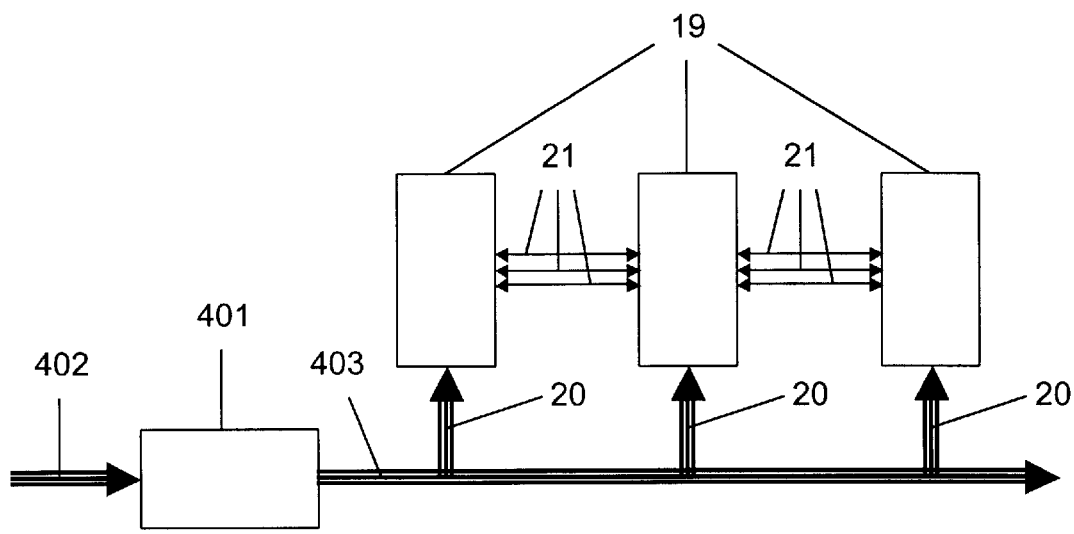
FIG. 9 is a schematic of a system clock implementation of an optical phase oscillator of FIG. 1.

The phase oscillator device 1 is ideally suited for use in phase-modulated circuits. For example, a phase oscillator device 401 is used as a system clock to synchronize a number of interconnected phase circuits 19, as shown in FIG. 9. The phase oscillator device 401 receives an input signal 402 and generates a phase oscillating output signal 403. The output signal 403 is used as a system clock input signal 20 for each of the interconnected phase circuits 19. The interconnected phase circuits 19 communicate with each other using interconnections 21. The interconnected phase circuits 19 use the common clock signal 20 so that they can synchronize the sending and receiving of messages, and, therefore, communicate properly.

Figure 10:
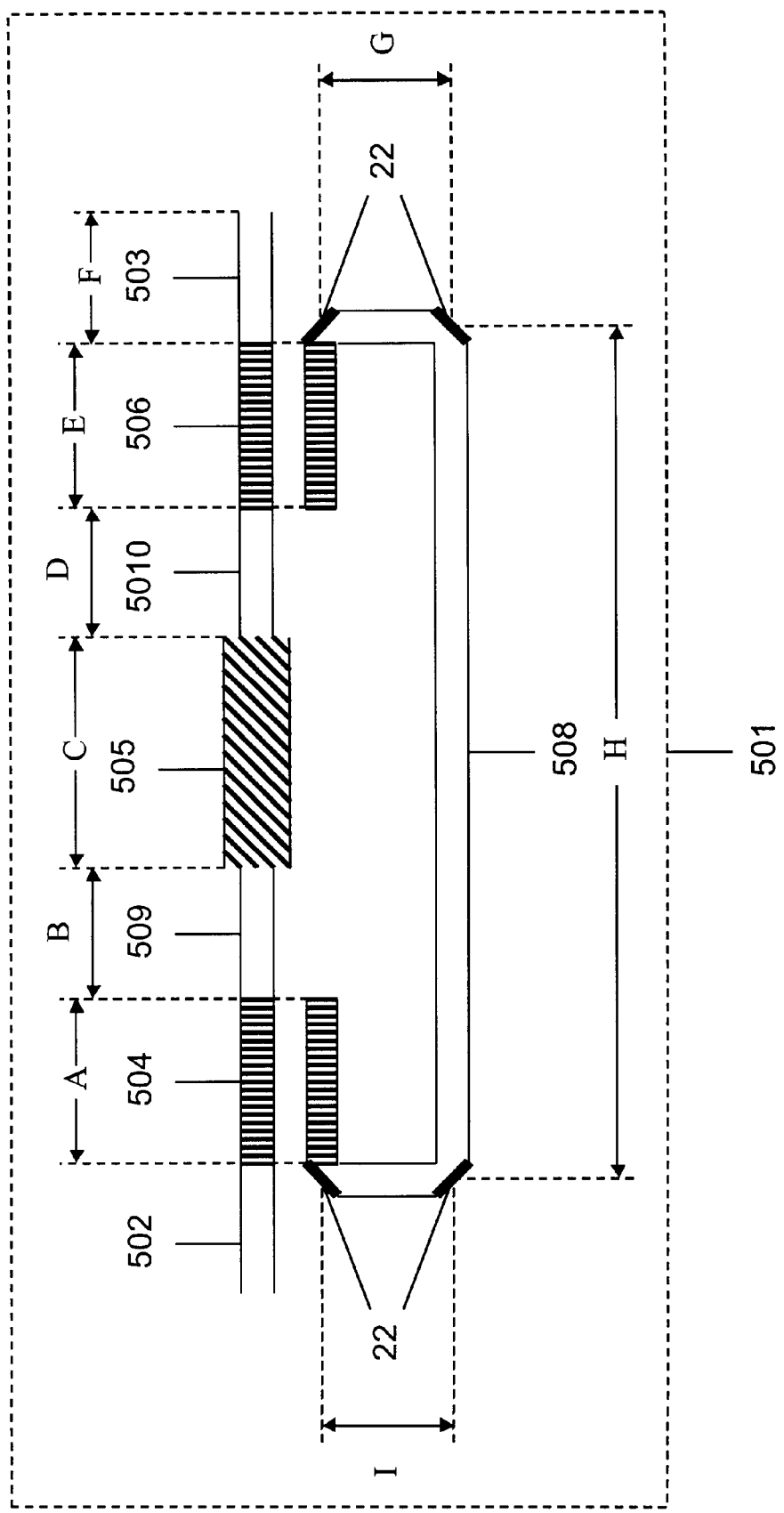
FIG. 10 is a design example of FIG. 3.

An integrated optic embodiment of the phase oscillator device 1 employs commonly available integrated optic components and operates using laser beams, preferably. A design example phase oscillator device 501, shown in FIG. 10 where like numerals with a prefix 50 refer to similar elements of the phase oscillator device 1 in FIG. 3, uses laser light with a wavelength of 0.85 μm. The component dimensions are listed in Table 5.

TABLE 5

| Component | Length |
|---|---|
| A | 157.1 μm |
| B | 42.9 μm |
| C | 50.0 μm |
| D | 8.3 μm |
| E | 157.1 μm |
| F | 42.9 μm |
| G | 15.0 μm |
| H | 420.0 μm |
| I | 15.0 μm |

Integrated optic directional couplers 504, 506 and waveguides 502, 509, 5010, 503, 508 are composed of $Al_{0.3}Ga_{0.7}As$, have a substrate of $Al_{0.8}Ga_{0.2}As$, and have air above the waveguide. The directional couplers 504, 506 are used for the combiner 4 and the splitter 6, have a waveguide spacing of 1 μm, and have a coupling coefficient of 0.005 $μm^{-1}$. The directional couplers 504, 506 and waveguides 502, 509, 5010, 503, 508 are rib waveguides with a rib width of 1 μm and a rib height of 500 nm where the rib is etched 200 nm. The rib waveguides have an effective index of refraction of 3.247. A semiconductor laser amplifier 505, typically composed of AlGaAs or InGaAsP, is used for the amplifier 5. The semiconductor laser amplifier 505 in this design example has an effective index of refraction of 4.

Since the second directional coupler 506 produces an inverted feedback signal, the phase inverter 7 is not required. Therefore, the length of the feedback waveguide 508, from the output of the splitter directional coupler 506 to the input of the combiner directional coupler 504 as indicated by G, H, and I in FIG. 10, should be an integral number of wavelengths. The number of wavelengths is $$\frac{3.247}{0.85 \, \mu m}(15.0 \, \mu m + 420.0 \, \mu m + 15.0 \, \mu m) = 1719 \text{ wavelengths}$$

where 3.247 is the effective refractive index of the feedback waveguide 508 and 0.85 μm is the wavelength of light used. Reflecting mirrors 22 are used to direct the beams through the feedback waveguide 508.

The frequency of the output signal 503 oscillations is found by calculating the time a signal requires to travel around the feedback loop. The travel time is calculated using the effective refractive index of each component as $$\frac{\eta \cdot L}{c} = time$$

where η is the effective refractive index of each component, L is the distance the light travels in the component, and c is the speed of light in a vacuum ($2.99792458 \times 10^8$ m/sec). The half-cycle travel time around the feedback loop is 9.5 picoseconds. This corresponds to a full-cycle oscillating frequency of 52.6 gigahertz. By adjusting the length of the feedback loop length and the component lengths, the oscillating frequency can be tuned to a desired specification.

Although the invention has been described with reference to certain specific embodiments, various modifications thereof will be apparent to those skilled in the art without departing from the spirit and scope of the invention as outlined in the claims appended hereto.

I claim:

1. An optical phase oscillator device comprising:
    a) an input signal that is a substantially coherent optical beam;
    b) a combiner for receiving said input signal and a feedback signal and combining said input signal with said feedback signal to produce a combined signal;
    c) an amplifier stage for receiving said combined signal, said amplifier stage increasing the magnitude of said combined signal and producing an amplified signal, said amplifier stage having a maximum output magnitude, and said amplifier stage including at least one amplifier utilizing an amplifying medium; and
    d) a splitter for receiving said amplified signal, said splitter dividing the amplified signal to produce a substantially coherent output signal and said feedback signal.

2. A phase oscillator device according to claim 1, further comprising at least one phase inverter placed between said splitter and said combiner for receiving said feedback signal and inverting the phase of said feedback signal to produce said feedback signal directed into said combiner that is substantially opposite in phase to said feedback signal of said splitter.

3. A phase oscillator device according to claim 1, wherein said amplifier stage includes at least one phase inverter.

4. A phase oscillator device according to claim 1, wherein said amplifier stage includes at least one amplifier utilizing an amplifying medium.

5. A phase oscillator device according to claim 4, wherein said at least one amplifier utilizing an amplifying medium has a maximum amplifier output magnitude.

6. A phase oscillator device according to claim 1, wherein said amplifier stage includes at least one signal limiter having a maximum output magnitude.

7. A phase oscillator device according to claim 1 having an initialization operating region, a steady-state operating region, and an anomalous operating region.

8. A phase oscillator device according to claim 7, where in said initialization operating region said output signal inverts in phase value at regular intervals, but varies irregularly in magnitude.

9. A phase oscillator device according to claim 7, where in said steady-state operating region said output signal oscillates and is a substantially continuous waveform with a substantially constant magnitude and a phase value that inverts at regular intervals.

10. A phase oscillator device according to claim 7, where in said anomalous operating region said output signal varies in magnitude but not in phase.

11. A phase oscillator device according to claim 7, where in said anomalous operating region said output signal varies in magnitude and phase.

12. A phase oscillator device according to claim 7, where in said anomalous operating region the magnitude and phase of said output signal do not vary.

13. A phase oscillator device according to claim 1, wherein said combiner and said splitter are integrated optic components selected from the group comprising Y-branches and directional couplers.

14. A phase oscillator device according to claim 4, wherein said amplifier is a semiconductor laser amplifier.

15. A phase oscillator device according to claim 5, wherein said amplifier is a semiconductor laser amplifier.

16. An optical phase oscillator device comprising:
    a) an input signal that is a substantially coherent optical beam;

b) a combiner for receiving said input signal and an amplified feedback signal and combining said input signal with said amplified feedback signal to produce a combined signal;

c) a splitter for receiving said combined signal, said splitter dividing the combined signal to produce a substantially coherent output signal and a feedback signal; and d) an amplifier stage for receiving said feedback signal, said amplifier stage increasing the magnitude of said feedback signal and producing said amplified feedback signal, said amplifier stage having a maximum output magnitude, and said amplifier stage including at least one amplifier utilizing an amplifying medium.

17. A phase oscillator device according to claim 16, further comprising at least one phase inverter placed between said combiner and said splitter for receiving said combined signal and inverting the phase of said combined signal to produce said combined signal directed into said splitter that is substantially opposite in phase to said combined signal of said combiner.

18. A phase oscillator device according to claim 16, wherein said amplifier stage includes at least one phase inverter.

19. A phase oscillator device according to claim 16, wherein said amplifier stage includes at least one amplifier utilizing an amplifying medium.

20. A phase oscillator device according to claim 19, wherein said at least one amplifier utilizing an amplifying medium has a maximum amplifier output magnitude.

21. A phase oscillator device according to claim 16, wherein said amplifier stage includes at least one signal limiter having a maximum output magnitude.

22. A phase oscillator device according to claim 16 having an initialization operating region, a steady-state operating region, and an anomalous operating region.

23. A phase oscillator device according to claim 22, where in said initialization operating region said output signal inverts in phase value at regular intervals, but varies irregularly in magnitude.

24. A phase oscillator device according to claim 22, where in said steady-state operating region said output signal oscillates and is a substantially continuous waveform with a substantially constant magnitude and a phase value that inverts at regular intervals.

25. A phase oscillator device according to claim 22, where in said anomalous operating region said output signal varies in magnitude but not in phase.

26. A phase oscillator device according to claim 22, where in said anomalous operating region said output signal varies in magnitude and phase.

27. A phase oscillator device according to claim 22, where in said anomalous operating region the magnitude and phase of said output signal do not vary.

28. A phase oscillator device according to claim 16, wherein said combiner and said splitter are integrated optic components selected from the group comprising Y-branches and directional couplers.

29. A phase oscillator device according to claim 19, wherein said amplifier is a semiconductor laser amplifier.

30. A phase oscillator device according to claim 20, wherein said amplifier is a semiconductor laser amplifier.

* * * * *